US012082426B2

United States Patent
Rodriguez-Martinez et al.

(10) Patent No.: US 12,082,426 B2
(45) Date of Patent: Sep. 3, 2024

(54) PHOTODETECTOR COMPOSITION

(71) Applicant: Sumitomo Chemical Co., Ltd., Tokyo (JP)

(72) Inventors: Francisco Javier Rodriguez-Martinez, Godmanchester (GB); Nir Yaacobi-Gross, Godmanchester (GB)

(73) Assignee: Sumitomo Chemical Co., Ltd., Tokyo (JP)

( * ) Notice: Subject to any disclaimer, the term of this patent is extended or adjusted under 35 U.S.C. 154(b) by 497 days.

(21) Appl. No.: 17/297,992

(22) PCT Filed: Nov. 29, 2019

(86) PCT No.: PCT/GB2019/053391
§ 371 (c)(1),
(2) Date: May 27, 2021

(87) PCT Pub. No.: WO2020/109822
PCT Pub. Date: Jun. 4, 2020

(65) Prior Publication Data
US 2022/0102658 A1 Mar. 31, 2022

(30) Foreign Application Priority Data

Nov. 30, 2018 (GB) ...................... 1819628

(51) Int. Cl.
*H10K 30/30* (2023.01)
*G01N 21/64* (2006.01)
(Continued)

(52) U.S. Cl.
CPC ........... *H10K 30/30* (2023.02); *G01N 21/645* (2013.01); *H10K 71/12* (2023.02); *H10K 85/615* (2023.02);
(Continued)

(58) Field of Classification Search
None
See application file for complete search history.

(56) References Cited

U.S. PATENT DOCUMENTS

2003/0136895 A1 7/2003 Ogawa
2010/0140559 A1* 6/2010 Klaus .................. C09B 23/04
977/735
2019/0157581 A1 5/2019 Seifrid et al.

FOREIGN PATENT DOCUMENTS

CN 107359243 A 11/2017
CN 107814811 A 3/2018
(Continued)

OTHER PUBLICATIONS

English machine translation of Wang (CN 107814811 A) accessed online from Espacenet; PDF pp. 1-10. (Year: 2018).*
(Continued)

*Primary Examiner* — Katie L. Hammer
(74) *Attorney, Agent, or Firm* — Wolf, Greenfield & Sacks, P.C.

(57) ABSTRACT

A composition comprising a first compound and a second compound of formula (I) wherein EDG is an electron-donating group comprising a polycyclic hetero aromatic group and each BAG is an electron-accepting group of formula (II) --- is a bond to EDG; each $R^{10}$ is, independently in each occurrence, H or a substituent; each $R^{11}$-$R^{14}$ is, independently in each occurrence, H or an electron-withdrawing group; and of the first and second compounds of formula (I), the total number of electron-withdrawing groups $R^{11}$-$R^{14}$ is greater for the first compound of formula (I). The composition may further contain an electron donor capable of donating an electron to the compounds of formula (I). The composition may be used in the photoactive layer of an organic photodetector.

(Continued)

(I)
(II)

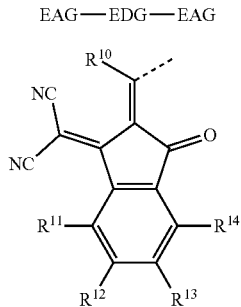

17 Claims, 3 Drawing Sheets

(51) Int. Cl.
*H10K 50/11* (2023.01)
*H10K 71/12* (2023.01)
*H10K 85/60* (2023.01)
*H10K 101/30* (2023.01)
*H10K 101/40* (2023.01)

(52) U.S. Cl.
CPC ......... *H10K 85/626* (2023.02); *H10K 85/653* (2023.02); *H10K 85/655* (2023.02); *H10K 85/6576* (2023.02); *G01N 2021/6463* (2013.01); *H10K 50/11* (2023.02); *H10K 2101/30* (2023.02); *H10K 2101/40* (2023.02); *Y02E 10/549* (2013.01)

(56) References Cited

FOREIGN PATENT DOCUMENTS

| | | |
|---|---|---|
| CN | 108365098 A | 8/2018 |
| JP | 2003-282937 A | 10/2003 |
| JP | 2009-264975 A | 11/2009 |
| WO | WO 2018/068722 A1 | 4/2018 |

OTHER PUBLICATIONS

International Search Report and Written Opinion mailed Feb. 20, 2020 in connection with International Application No. PCT/GB2019/053391.

Combined Search and Examination Report dated Jun. 3, 2019 in connection with GB Application No. 1819628.7.

Lee et al., Ternary blend composed of two organic donors and one acceptor for active layer of high-performance organic solar cells. ACS applied materials & interfaces. May 4, 2016;8(17):10961-7.

Japanese Office Action dated Jan. 16, 2023, in connection with Japanese Application No. 2021-530136.

Gao et al. Multi-component non-fullerence acceptors with tunable bandgap structures for efficient organic solar cells. Journal of Materials Chemistry A. Oct. 2018;(6):23644-23649.

* cited by examiner

PHOTODETECTOR COMPOSITION

RELATED APPLICATIONS

This Application is a national stage filing under 35 U.S.C. § 371 of international PCT application no. PCT/GB2019/053391, filed Nov. 29, 2019, which claims priority to United Kingdom patent application no. GB 1819628.7, filed Nov. 30, 2018, each of which is incorporated herein by reference in its entirety.

BACKGROUND

The disclosure relates to compositions for use in organic electronic devices, in particular organic photodetectors.

A range of organic electronic devices comprising organic semiconductor materials are known, including organic light-emitting devices, organic field effect transistors, organic photovoltaic devices and organic photodetectors (OPDs).

CN108365098 discloses a ternary organic solar cell having an active layer of a blend of a polymeric electron donor PBDB-T and two types of electron acceptors HF-PCIC and IEICO-4F.

WO2017/191466 discloses an organic solar cell comprising a blend of two or more organic electron acceptor compounds and an organic electron donor compound.

WO2018/068722 discloses an organic solar cell having a photoactive layer having at least one donor polymer and two non-fullerene molecular acceptors or one donor polymer, one fullerene acceptor, and one non-fullerene molecular acceptor.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is desirable for an organic photodetector to possess both high external quantum efficiency and low dark current (i.e. current generated by the photodetector when no light is incident on the OPD. However, the present inventors have found that materials giving a higher external quantum efficiency may cause dark current to increase as compared to materials having a lower external quantum efficiency.

The present inventors have found that mixtures of certain electron acceptor compounds may provide a balance between high external quantum efficiency and low dark current.

In some embodiments, the present disclosure provides a composition containing a first compound and a second compound of formula (I):

$$EAG-EDG-EAG \quad (I)$$

wherein EDG is an electron-donating group comprising a polycyclic heteroaromatic group and each EAG is an electron-accepting group of formula (II):

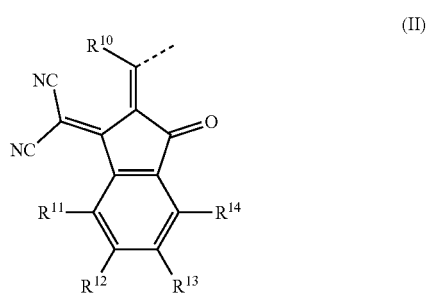

wherein:
--- is a bond to EDG;
each $R^{10}$ is, independently in each occurrence, H or a substituent;
each $R^{11}$-$R^{14}$ is, independently in each occurrence, an electron-withdrawing group; and of the first and second compounds of formula (I), the total number of electron-withdrawing groups $R^{11}$-$R^{14}$ is greater for the first compound of formula (I).

In some embodiments, there is provided a formulation comprising a composition as described herein dissolved or dispersed in one or more solvents.

In some embodiments, there is provided an organic photodetector comprising: an anode; a cathode; and a photosensitive organic layer disposed between the anode and cathode wherein the photosensitive organic layer comprises a composition as described herein and including a donor compound.

In some embodiments, there is provided a circuit comprising an organic photodetector as described herein, and at least one of a voltage source for applying a reverse bias to the organic photodetector and a device configured to measure photocurrent generated by the photodetector.

In some embodiments, there is provided a method of forming an organic photodetector as described herein comprising formation of the photosensitive organic layer over one of the anode and cathode and formation of the other of the anode and cathode over the photosensitive organic layer.

In some embodiments, there is provided a photosensor comprising a light source and an organic photodetector as described herein configured to detect light emitted from the light source.

In some embodiments, there is provided a method of determining the presence and/or concentration of a target material in a sample, the method comprising illuminating the sample and measuring a response of an organic photodetector as described herein which is configured to receive light emitted from the sample upon illumination.

DESCRIPTION OF DRAWINGS

The disclosed technology and accompanying figures describe some implementations of the disclosed technology.

Figure 1:
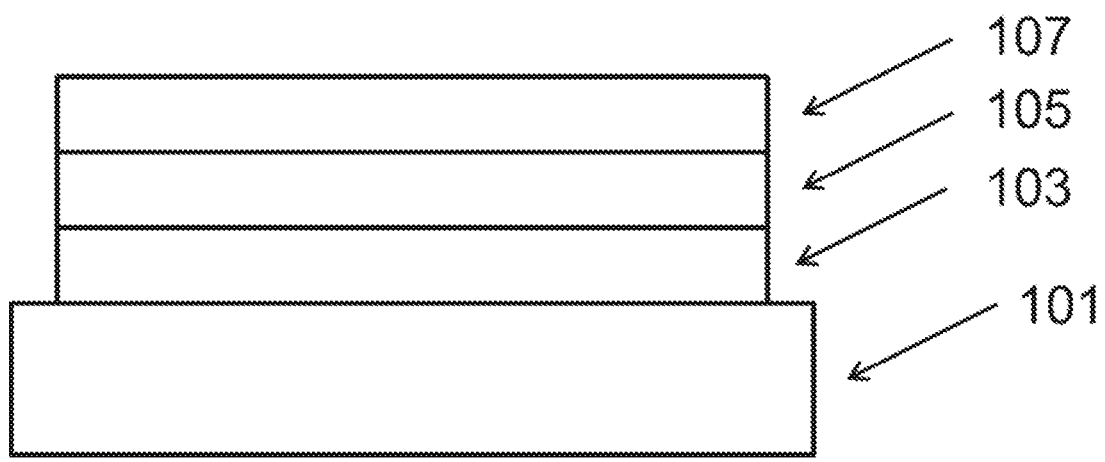
FIG. 1 illustrates an organic photodetector according to some embodiments of the present disclosure.

The drawings are not drawn to scale and have various viewpoints and perspectives. The drawings are some implementations and examples. Additionally, some components and/or operations may be separated into different blocks or combined into a single block for the purposes of discussion of some of the embodiments of the disclosed technology. Moreover, while the technology is amenable to various modifications and alternative forms, specific embodiments have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the following description, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

FIG. 1 illustrates an OPD according to some embodiments of the present disclosure. The OPD comprises a cathode 103, an anode 107 and a bulk heterojunction layer 105 disposed between the anode and the cathode. The OPD may be supported on a substrate 101, optionally a glass or plastic substrate.

FIG. 1 illustrates an arrangement in which the cathode is disposed between the substrate and the anode. In other embodiments, the anode may be disposed between the cathode and the substrate.

The bulk heterojunction layer comprises a mixture of two or more electron acceptors and at least one electron donor. Optionally, the bulk heterojunction layer consists of the electron acceptors and the electron donor.

Each of the anode and cathode may independently be a single conductive layer or may comprise a plurality of layers.

The OPD may comprise layers other than the anode, cathode and bulk shown in FIG. 1. In some embodiments, a hole-transporting layer is disposed between the anode and the bulk heterojunction layer. In some embodiments, an electron-transporting layer is disposed between the cathode and the bulk heterojunction layer. In some embodiments, a work function modification layer is disposed between the bulk heterojunction layer and the anode, and/or between the bulk heterojunction layer and the cathode.

In use, the photodetectors as described in this disclosure may be connected to a voltage source for applying a reverse bias to the device and/or a device configured to measure photocurrent. The voltage applied to the photodetectors may be variable. In some embodiments, the photodetector may be continuously biased when in use.

In some embodiments, a photodetector system comprises a plurality of photodetectors as described herein, such as an image sensor of a camera.

In some embodiments, a sensor may comprise an OPD as described herein and a light source wherein the OPD is configured to receive light emitted from the light source.

In some embodiments, the light source emits near infrared light, optionally light having a peak wavelength greater than 750 nm, optionally greater than 900 nm, optionally up to about 1500 nm.

In some embodiments, the light from the light source may or may not be changed before reaching the OPD. For example, the light may be filtered, down-converted or up-converted before it reaches the OPD.

The bulk heterojunction layer may contain first and second electron acceptor (n-type) compounds, each of the first and second compounds being a compound of formula (I):

EAG-EDG-EAG    (I)

wherein EDG is an electron-donating group comprising a polycyclic heteroaromatic group and each EAG is an electron-accepting group of formula (II):

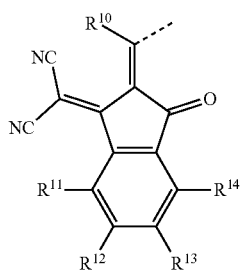

(II)

---- is a bond to EDG;
each $R^{10}$ is, independently in each occurrence, H or a substituent;
each $R^{11}$-$R^{14}$ is, independently in each occurrence, an electron-withdrawing group; and
of the first and second compounds of formula (I), the total number of electron-withdrawing groups groups $R^{11}$-$R^{14}$ is greater for the first compound of formula (I).

Preferred electron-withdrawing groups are selected from CN, F, Cl, Br and I, more preferably F and CN, most preferably F.

In some embodiments, each occurrence of at least two of $R^1$-$R^{14}$ of the first compound is an electron-withdrawing group.

In some embodiments, each occurrence of $R^1$-$R^{14}$ of the second compound is H.

In some embodiments, one or more of $R^1$-$R^{14}$ of the second compound is an electron-withdrawing group, with the proviso that the total number of $R^1$-$R^{14}$ groups of the second compound which are electron-withdrawing groups is fewer than that of the first compound.

Each EAG of formula (II) has a LUMO level that is deeper (i.e. further from vacuum) than that of EDG, preferably at least 1 eV deeper. The LUMO of EAG of formula (II) of the first compound is preferably deeper than that of EAG of formula (II) of the second compound. The LUMO levels of EAG and EDG may be as determined by modelling the LUMO level of EAG-H and H-EDG-H, i.e. by replacing the bonds between EAG and EDG with bonds to a hydrogen atom. Modelling may be performed using Gaussian09 software available from Gaussian using Gaussian09 with B3LYP (functional) and LACVP* (Basis set).

Optionally, EDG comprises a fused heteroaromatic group containing at least one fused thiophene. Optionally, the fused heteroaromatic group comprises or consists of fused thiophene and at least one of benzene and cyclopentadiene groups, each of which may independently be unsubstituted or substituted with one or more substituents. Each thiophene is optionally unsubstituted or substituted with one or more groups $R^4$ other than H. Each benzene is optionally unsubstituted or substituted with one or more groups $R^3$ other than H. Each cyclopentadiene is optionally unsubstituted or substituted with one or more groups $R^1$. $R^1$, $R^3$ and $R^4$ are as described below with reference to Formulae (Ia) and (Ib).

Optionally, EDG is selected from:

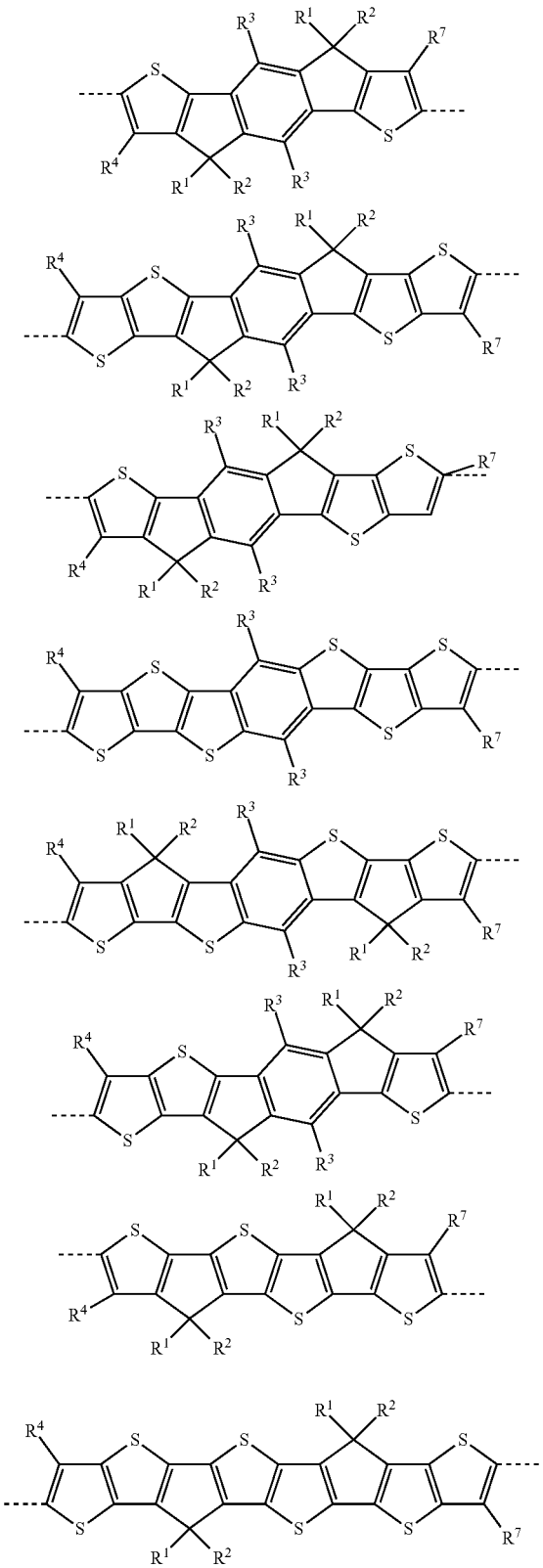

-continued

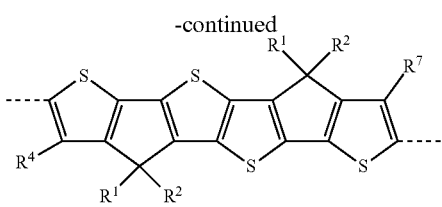

R$^1$, R$^2$, R$^3$, R$^4$ and R$^7$ are as described below with reference to Formulae (Ia) and (Ib).

EDG of the first compound may be the same as or different from EDG of the second compound.

Optionally, at least one of the first and second compounds of formula (I) has formula (Ia):

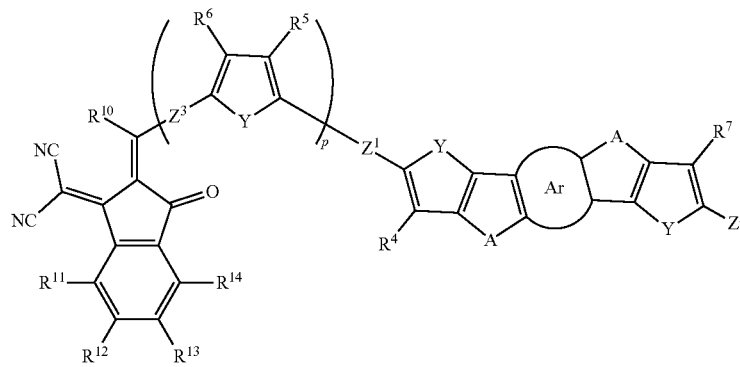

(Ia)

wherein:
Ar is furan, thiophene or benzene which is unsubstituted or substituted with one or more substituents;
each Y is independently O or S;
each A is independently O, S or CR$^1$R$^2$ wherein R$^1$ and R$^2$ independently in each occurrence is a substituent;
each R$^4$-R$^9$ is independently H or a substituent;
p is 0, 1, 2 or 3;
q is 0, 1, 2 or 3;
Z$^1$ is a direct bond or, together with R$^4$ or R$^5$, forms an aromatic or heteroaromatic group Ar$^1$;

Z$^2$ is a direct bond or, together with R$^7$ or R$^8$, forms an aromatic or heteroaromatic group Ar$^2$;
Z$^3$ is a direct bond or, together with R$^6$, forms an aromatic or heteroaromatic group Ar$^3$; and
Z$^4$ is a direct bond or, together with R$^9$, forms an aromatic or heteroaromatic group Ar$^4$.

In some embodiments, each Z$^1$-Z$^4$ is a direct bond.

In some embodiments, Z$^1$ and R$^4$ form an unsubstituted or substituted thiophene or furan group; Z$^2$ and R$^7$ form an unsubstituted or substituted thiophene or furan group; and p and q are each 0.

In embodiments where one or more of Z$^1$-Z$^4$ forms part of an aromatic or heteroaromatic group Ar$^1$-Ar$^4$, respectively, each Ar$^1$-Ar$^4$ (where present) is preferably a thiophene.

Ar$^1$-Ar$^4$ are each independently unsubstituted or substituted with one or more substituents. Optionally, substituents of Ar$^1$-Ar$^4$ are selected from C$_{1-12}$ alkyl wherein one or more non-adjacent, non-terminal C atoms may be replaced with O, S, COO or CO.

By "non-terminal" C atom of an alkyl group as used herein is meant a C atom of the alkyl other than the methyl C atom of a linear (n-alkyl) chain or the methyl C atoms of a branched alkyl chain.

Optionally, at least one of the first and second compounds of formula (I) has formula (Ib):

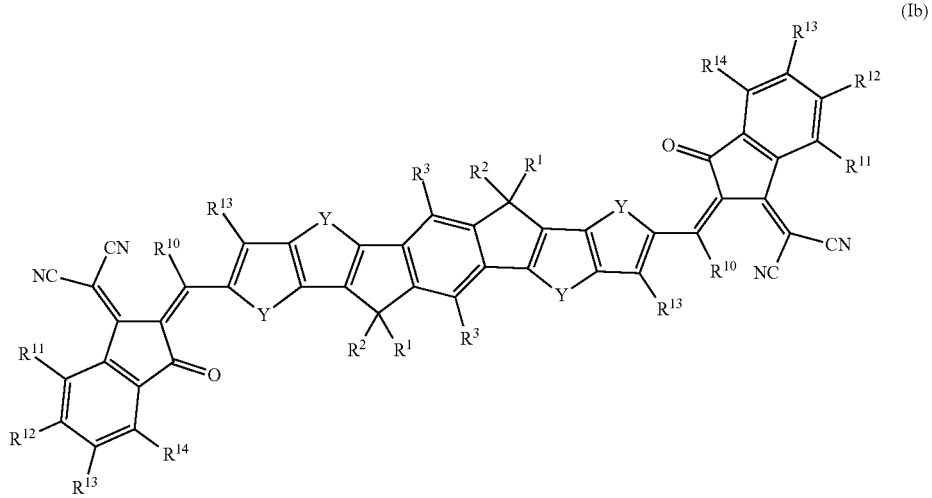

(Ib)

wherein each $R^3$ is, independently in each occurrence, H or a substituent.

Optionally, $R^1$ and $R^2$ of formula (Ia) or (Ib) independently in each occurrence are selected from the group consisting of:

linear, branched or cyclic $C_{1-20}$ alkyl wherein one or more non-adjacent, non-terminal C atoms may be replaced by O, S, $NR^{15}$, CO or COO wherein $R^5$ is a $C_{1-12}$hydrocarbyl and one or more H atoms of the $C_{1-20}$ alkyl may be replaced with F; and a group of formula $(Ak)u-(Ar^6)v$ wherein Ak is a $C_{1-12}$ alkylene chain in which one or more C atoms may be replaced with O, S, CO or COO; u is 0 or 1; $Ar^6$ in each occurrence is independently an aromatic or heteroaromatic group which is unsubstituted or substituted with one or more substituents; and v is at least 1, optionally 1, 2 or 3.

$Ar^6$ is preferably phenyl.

Where present, substituents of $Ar^6$ may be a substituent $R^{17}$ wherein $R^{17}$ in each occurrence is independently selected from $C_{1-20}$ alkyl wherein one or more non-adjacent, non-terminal C atoms may be replaced by O, S, $NR^{15}$, CO or COO and one or more H atoms of the $C_{1-20}$ alkyl may be replaced with F.

A hydrocarbyl group as described anywhere herein is optionally selected from $C_{1-20}$ alkyl; unsubstituted phenyl; and phenyl substituted with one or more $C_{1-12}$ alkyl groups.

If v is 3 or more then $-(Ar^6)v$ may be a linear or branched chain of $Ar^6$ groups. A linear chain of $Ar^6$ groups as described herein has only one monovalent terminal $Ar^6$ group whereas a branched chain of $Ar^6$ groups has at least two monovalent terminal $Ar^6$ groups.

Optionally, at least one of $R^1$ and $R^2$ in each occurrence, optionally each $R^1$ and $R^2$, is phenyl which is unsubstituted or substituted with one or more substituents selected from $C_{1-20}$ alkyl wherein one or more non-adjacent, non-terminal C atoms may be replaced by O, S, $NR^5$, CO or COO and one or more H atoms of the $C_{1-20}$ alkyl may be replaced with F.

Optionally, each $R^4$-$R^9$ of formula (Ia) or (Ib) is independently selected from:

H;

$C_{1-12}$ alkyl wherein one or more non-adjacent, non-terminal C atoms may be replaced with O, S, COO or CO; and an aromatic or heteroaromatic group $Ar^5$ which is unsubstituted or substituted with one or more substituents.

Optionally, each $R^3$ of formula (Ib) independently in each occurrence is selected from:

H;

$C_{1-12}$ alkyl wherein one or more non-adjacent, non-terminal C atoms may be replaced with O, S, COO or CO; and an aromatic or heteroaromatic group $Ar^5$ which is unsubstituted or substituted with one or more substituents.

$Ar^5$ is preferably an aromatic group, more preferably phenyl.

The one or more substituents of $Ar^5$, if present, may be selected from $C_{1-12}$ alkyl wherein one or more non-adjacent, non-terminal C atoms may be replaced with O, S, COO or CO.

In some embodiments, each $R^3$-$R^{10}$ is independently selected from H; $C_{1-20}$ alkyl; and $C_{1-20}$ alkoxy.

Exemplary compounds of formula (I) are:

ITIC

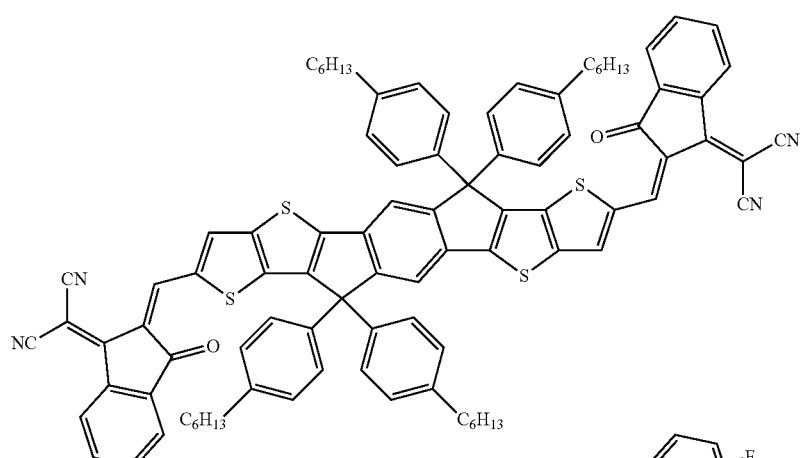

ITIC-2F

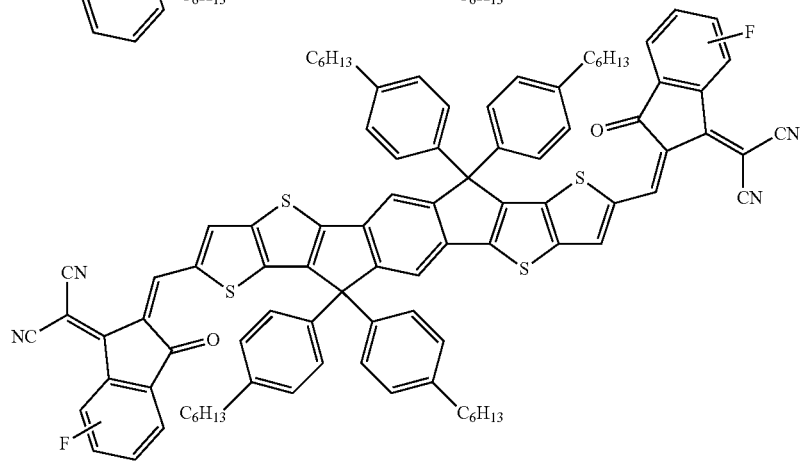

-continued
ITIC-4F
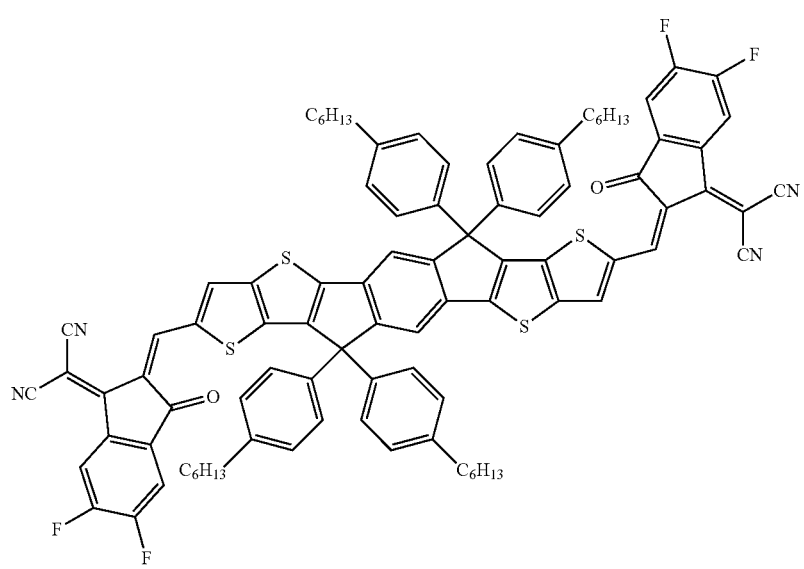
IEICO
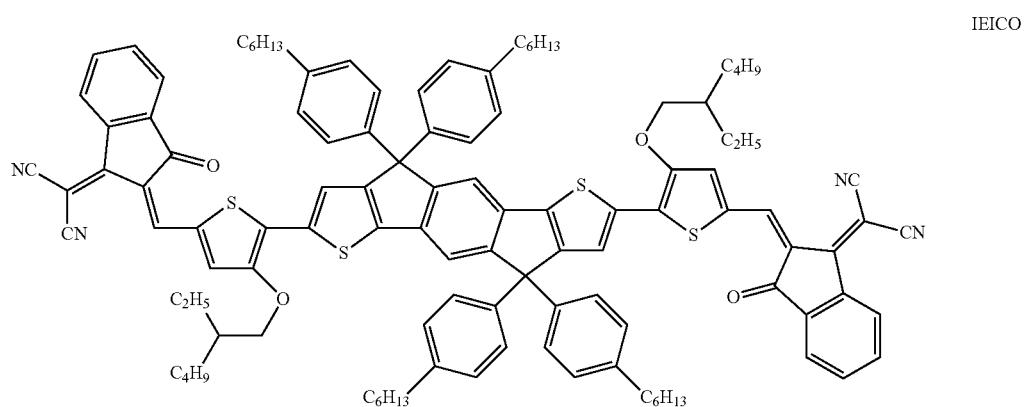
IEICO-2F
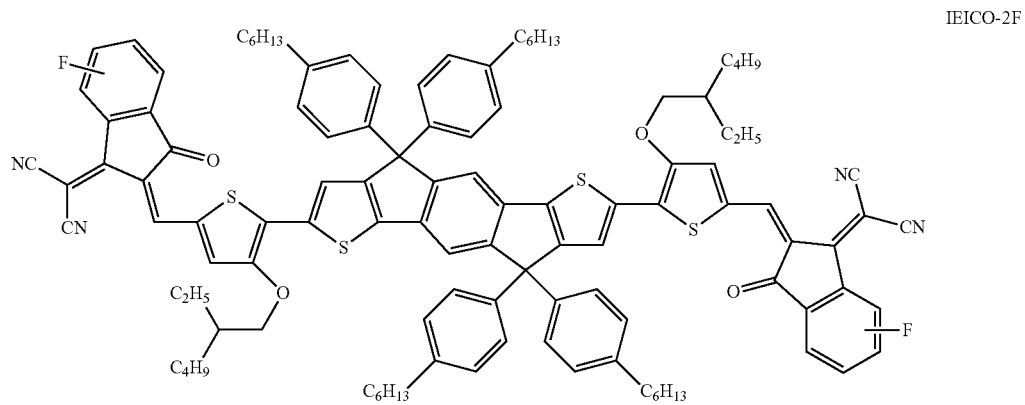

IEICO-4F

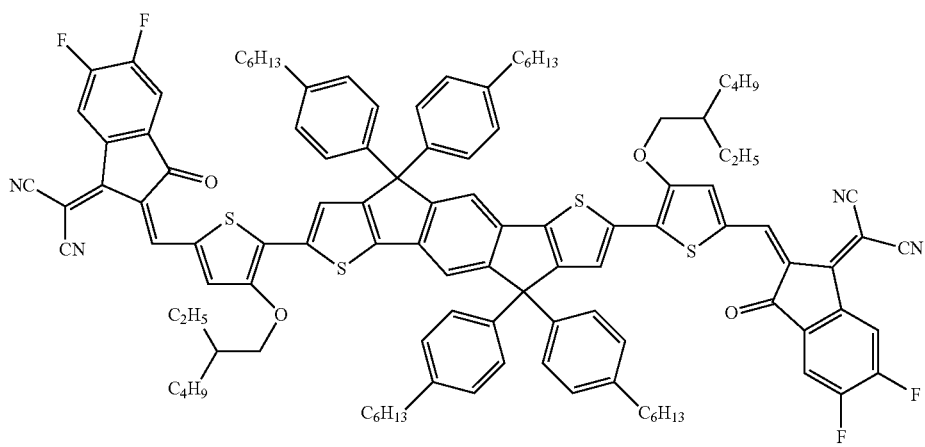

The first compound:second compound weight ratio may be in the range of 99:1-1:99, optionally 10:90-90:10, optionally 75:25-25:75.

The first and second compounds may be used in combination with a fullerene acceptor.

The first and second compound:fullerene acceptor weight ratio may be in the range of about 1:0.1-1:1, preferably in the range of about 1:0.1-1:0.5.

The fullerene may be a $C_{60}$, $C_{70}$, $C_{76}$, $C_{78}$ or $C_{84}$ fullerene or a derivative thereof including, without limitation, PCBM-type fullerene derivatives (including phenyl-C61-butyric acid methyl ester ($C_{60}$PCBM) and phenyl-C71-butyric acid methyl ester ($C_{70}$PCBM)), TCBM-type fullerene derivatives (e.g. tolyl-C61-butyric acid methyl ester ($C_{60}$TCBM)), and ThCBM-type fullerene derivatives (e.g. thienyl-C61-butyric acid methyl ester ($C_{60}$ThCBM)

Where present, a fullerene acceptor may have formula (III):

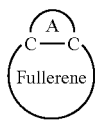

(III)

wherein A, together with the C-C group of the fullerene, forms a monocyclic or fused ring group which may be unsubstituted or substituted with one or more substituents.

Exemplary fullerene derivatives include formulae (IIIa), (IIIb) and (IIIc):

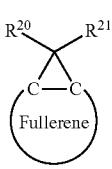

(IIIa)

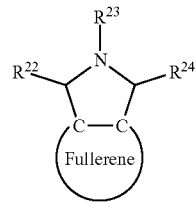

(IIIb)

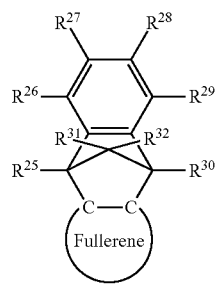

(IIIc)

wherein $R^{20}$-$R^{32}$ are each independently H or a substituent.

Substituents $R^{20}$-$R^{32}$ are optionally and independently in each occurrence selected from the group consisting of aryl or heteroaryl, optionally phenyl, which may be unsubstituted or substituted with one or more substituents; and $C_{1-20}$ alkyl wherein one or more non-adjacent, non-terminal C atoms may be replaced with O, S, CO or COO and one or more H atoms may be replaced with F.

Substituents of aryl or heteroaryl groups $R^{20}$-$R^{32}$, where present, are optionally selected from $C_{1-12}$ alkyl wherein one or more non-adjacent, non-terminal C atoms may be replaced with O, S, CO or COO and one or more H atoms may be replaced with F.

The donor (p-type) compound is not particularly limited and may be appropriately selected from electron donating materials that are known to the person skilled in the art, including organic polymers and non-polymeric organic molecules. The p-type compound has a HOMO deeper (further from vacuum) than a LUMO of each compound of formula (I). Optionally, the gap between the HOMO level of the p-type donor and the LUMO level of each n-type acceptor compound of formula (I) is less than 1.4 eV.

In a preferred embodiment the p-type donor compound is an organic conjugated polymer, which can be a homopolymer or copolymer including alternating, random or block copolymers. Preferred are non-crystalline or semi-crystalline conjugated organic polymers. Further preferably the p-type organic semiconductor is a conjugated organic polymer with a low bandgap, typically between 2.5 eV and 1.5 eV, preferably between 2.3 eV and 1.8 eV.

Optionally, the p-type donor has a HOMO level no more than 5.5 eV from vacuum level. Optionally, the p-type donor has a HOMO level at least 4.1 eV from vacuum level.

As exemplary p-type donor polymers, polymers selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(monosubstituted pyrrole), poly(3,4-bisubstituted pyrrole), poly-1,3,4-oxadiazoles, polyisothianaphthene, derivatives and co-polymers thereof may be mentioned. Preferred examples of p-type donors are copolymers of polyfluorenes and polythiophenes, each of which may be substituted, and polymers comprising benzothiadiazole-based and thiophene-based repeating units, each of which may be substituted. It is understood that the p-type donor may also consist of a mixture of a plurality of electron donating materials.

Optionally, the donor polymer comprises a repeat unit of formula (IV):

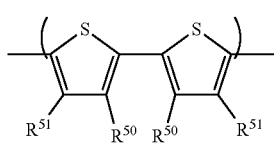

(IV)

wherein $R^{50}$ and $R^{51}$ independently in each occurrence is H or a substituent.

Substituents $R^{50}$ and $R^{51}$ may be selected from groups other than H described with respect to $R^4$ and $R^7$.

Preferably, each $R^{50}$ is a substituent. In a preferred embodiment, the $R^{50}$ groups are linked to form a group of formula $-Z^1-C(R^{52})_2-$ wherein $Z^1$ is O, $NR^5$, or $C(R^{52})_2$; $R^{52}$ in each occurrence is H or a substituent, preferably a substituent as described with reference to $R^1$, most preferably a $C_{1-30}$ hydrocarbyl group; and $R^{53}$ is a substituent, preferably a $C_{1-30}$ hydrocarbyl group.

Preferably, each $R^{51}$ is H.

Optionally, the donor polymer comprises a repeat unit of formula (V):

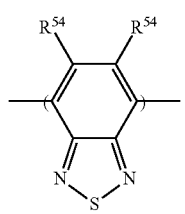

(V)

wherein $R^{54}$ in each occurrence is independently H or a substituent. Optionally, substituents $R^{54}$ are selected from the group consisting of F, CN, $NO_2$, and $C_{1-20}$ alkyl wherein one or more non-adjacent, non-terminal C atoms may be replaced with O, S, CO or COO and one or more H atoms may be replaced with F.

Exemplary donor materials are disclosed in, for example, WO2013/051676, the contents of which are incorporated herein by reference.

In some embodiments, the weight of the donor compound to the acceptor compound is from about 1:0.5 to about 1:2.

Preferably, the weight ratio of the donor compound to the acceptor compound is about 1:1 or about 1:1.5.

At least one of the first and second electrodes is transparent so that light incident on the device may reach the bulk heterojunction layer. In some embodiments, both of the first and second electrodes are transparent.

Each transparent electrode preferably has a transmittance of at least 70%, optionally at least 80%, to wavelengths in the range of 300-900 nm.

In some embodiments, one electrode is transparent and the other electrode is reflective.

Optionally, the transparent electrode comprises or consists of a layer of transparent conducting oxide, preferably indium tin oxide or indium zinc oxide. In preferred embodiments, the electrode may comprise poly 3,4-ethylenedioxythiophene (PEDOT).

In other preferred embodiments, the electrode may comprise a mixture of PEDOT and polystyrene sulfonate (PSS). The electrode may consist of a layer of PEDOT:PSS.

Optionally, the reflective electrode may comprise a layer of a reflective metal. The layer of reflective material may be aluminium or silver or gold. In some embodiments, a bi-layer electrode may be used. For example, the electrode may be an indium tin oxide (ITO)/silver bi-layer, an ITO/aluminium bi-layer or an ITO/gold bi-layer.

The device may be formed by forming the bulk heterojunction layer over one of the anode and cathode supported by a substrate and depositing the other of the anode or cathode over the bulk heterojunction layer.

The area of the OPD may be less than about 3 cm², less than about 2 cm², less than about 1 cm², less than about 0.75 cm², less than about 0.5 cm² or less than about 0.25 cm². The substrate may be, without limitation, a glass or plastic substrate. The substrate can be described as an inorganic semiconductor. In some embodiments, the substrate may be silicon. For example, the substrate can be a wafer of silicon. The substrate is transparent if, in use, incident light is to be transmitted through the substrate and the electrode supported by the substrate.

The substrate supporting one of the anode and cathode may or may not be transparent if, in use, incident light is to be transmitted through the other of the anode and cathode.

The bulk heterojunction layer may be formed by any process including, without limitation, thermal evaporation and solution deposition methods.

Preferably, the bulk heterojunction layer is formed by depositing a formulation comprising the acceptor material and the electron donor material dissolved or dispersed in a solvent or a mixture of two or more solvents. The formulation may be deposited by any coating or printing method including, without limitation, spin-coating, dip-coating, roll-coating, spray coating, doctor blade coating, wire bar coating, slit coating, ink jet printing, screen printing, gravure printing and flexographic printing.

The one or more solvents of the formulation may optionally comprise or consist of benzene substituted with one or more substituents selected from chlorine, $C_{1-10}$ alkyl and $C_{1-10}$ alkoxy wherein two or more substituents may be linked to form a ring which may be unsubstituted or substituted with one or more $C_{1-6}$ alkyl groups, optionally toluene, xylenes, trimethylbenzenes, tetramethylbenzenes, anisole, indane and its alkyl-substituted derivatives, and tetralin and its alkyl-substituted derivatives.

The formulation may comprise a mixture of two or more solvents, preferably a mixture comprising at least one benzene substituted with one or more substituents as described above and one or more further solvents. The one or more further solvents may be selected from esters, optionally alkyl or aryl esters of alkyl or aryl carboxylic acids, optionally a $C_{1-10}$ alkyl benzoate, benzyl benzoate or dimethoxybenzene. In preferred embodiments, a mixture of trimethylbenzene and benzyl benzoate is used as the solvent. In other preferred embodiments, a mixture of trimethylbenzene and dimethoxybenzene is used as the solvent.

The formulation may comprise further components in addition to the electron acceptor, the electron donor and the one or more solvents. As examples of such components, adhesive agents, defoaming agents, deaerators, viscosity enhancers, diluents, auxiliaries, flow improvers colourants, dyes or pigments, sensitizers, stabilizers, nanoparticles, surface-active compounds, lubricating agents, wetting agents, dispersing agents and inhibitors may be mentioned.

The organic photodetector as described herein may be used in a wide range of applications including, without limitation, detecting the presence and/or brightness of ambient light and in a sensor comprising the organic photodetector and a light source. The photodetector may be configured such that light emitted from the light source is incident on the photodetector and changes in wavelength and/or brightness of the light may be detected, e.g. due to absorption by and/or emission of light from a target material in a sample disposed in a light path between the light source and the organic photodetector. The sensor may be, without limitation, a gas sensor, a biosensor, an X-ray imaging device, an image sensor such as a camera image sensor, a motion sensor (for example for use in security applications) a proximity sensor or a fingerprint sensor. A 1D or 2D photosensor array may comprise a plurality of photodetectors as described herein in an image sensor. The photodetector may be configured to detect light emitted from a target analyte which emits light upon irradiation by the light source or which is bound to a luminescent tag which emits light upon irradiation by the light source. The photodetector may be configured to detect a wavelength of light emitted by the target analyte or a luminescent tag bound thereto.

EXAMPLES

Mixtures of acceptor materials were formed from compounds set out in Table 1.

TABLE 1

| Compound | LUMO (eV) |
|---|---|
| ITIC | 3.95 |
| ITIC-2F | 4.03 |
| ITIC-4F | 4.09 |

Device Example 1

A device having the following structure was prepared:
Cathode/Donor: Acceptor layer/Anode A glass substrate coated with indium-tin oxide (ITO) was treated with polyethyleneimine (PEIE) to modify the work function of the ITO.

A ca. 600 nm thick bulk heterojunction layer of a mixture of a donor polymer having a HOMO level of 5.2 eV, ITIC and ITIC-4F was deposited over the modified ITO layer by bar coating from a 15 mg/ml solution in 1,2,4-trimethylbenzene:1,3-dimethyoxybenzene (9:1 v/v) in a donor:acceptor mass ratio of 1:1.5. The mass ratio of the acceptor compounds ITIC and ITIC-4F in the mixture was 1:1. The resultant layer was dried under vacuum at 80° C.

An anode (Clevios HIL-E100) available from Heraeus was formed over the donor/acceptor mixture layer by spin-coating.

Device Example 2

A device was prepared as described for Device Example 1 except that ITIC-2F was used in place of ITIC-4F.

Device Example 3

A device was prepared as described for Device Example 1 except that ITIC-2F was used in place of ITIC.

Comparative Device 1

For the purpose of comparison, a device was prepared as described for Device Example 1 except that ITIC-4F is the only acceptor compound present in the bulk heterojunction layer.

Comparative Device 2

For the purpose of comparison, a device was prepared as described for Device Example 1 except that ITIC-2F is the only acceptor compound present in the bulk heterojunction layer.

Comparative Device 3

For the purpose of comparison, a device was prepared as described for Device Example 1 except that ITIC is the only acceptor compound present in the bulk heterojunction layer.

Figure 2A:
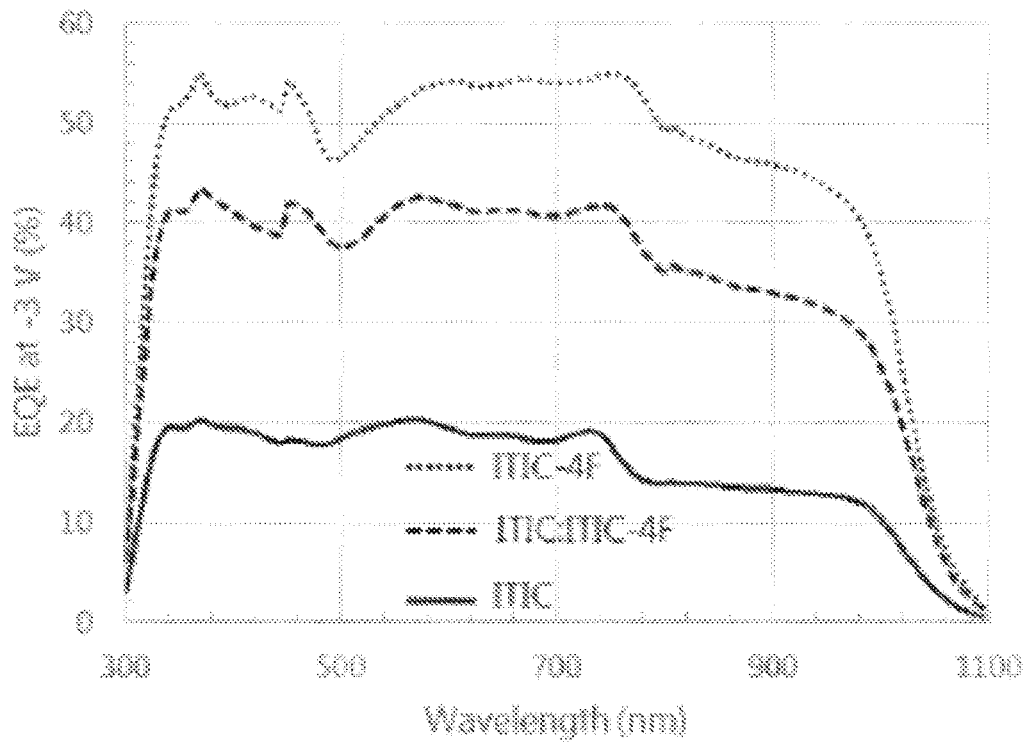
FIG. 2A is a graph of external quantum efficiency vs. wavelength for an OPD according to some embodiments having a bulk heterojunction layer containing one fluorinated and one non-fluorinated acceptor and two comparative OPDs containing only one acceptor.
Figure 2B:
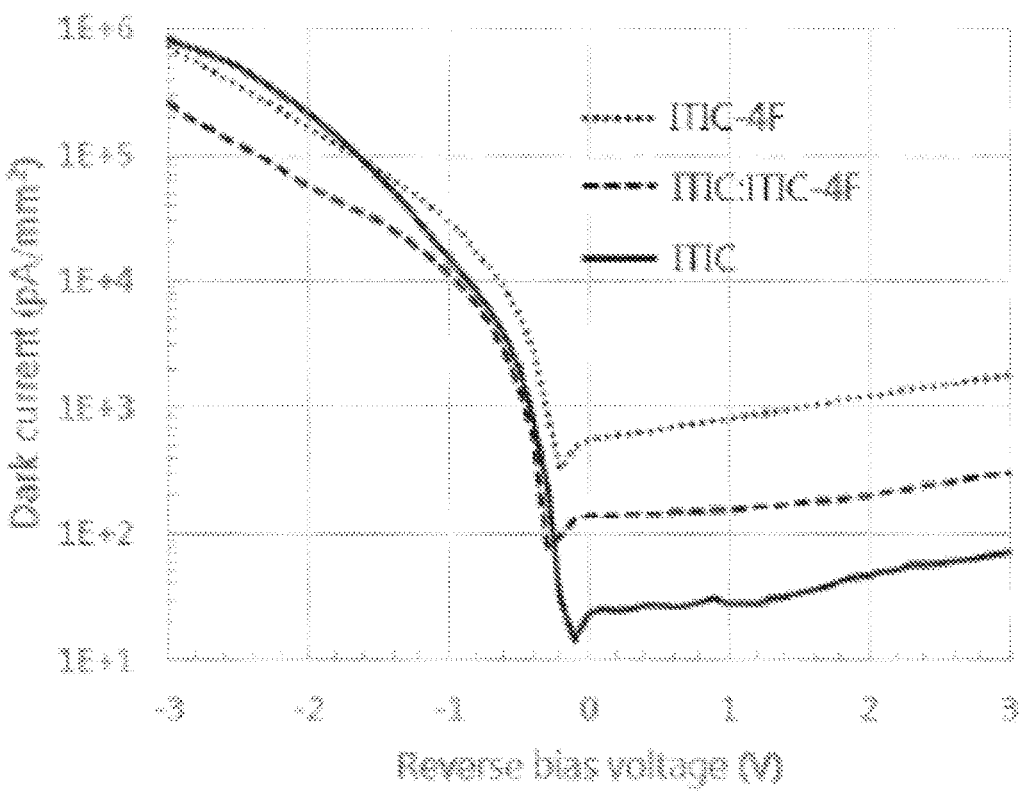
FIG. 2B is a graph of dark current vs. reverse bias for the OPDs described with reference to FIG. 2A.

With reference to FIGS. 2A and 2B, Comparative Device 1 containing ITIC-4F as the only acceptor has the highest external quantum efficiency but also the highest dark current. Conversely, Comparative Device 2 containing ITIC as the only acceptor has the lowest dark current lowest but also the lowest external quantum efficiency.

By providing a mixture of these acceptor materials as in Device Example 1, relatively good external quantum efficiency and relatively low dark current can be achieved.

Figure 3A:
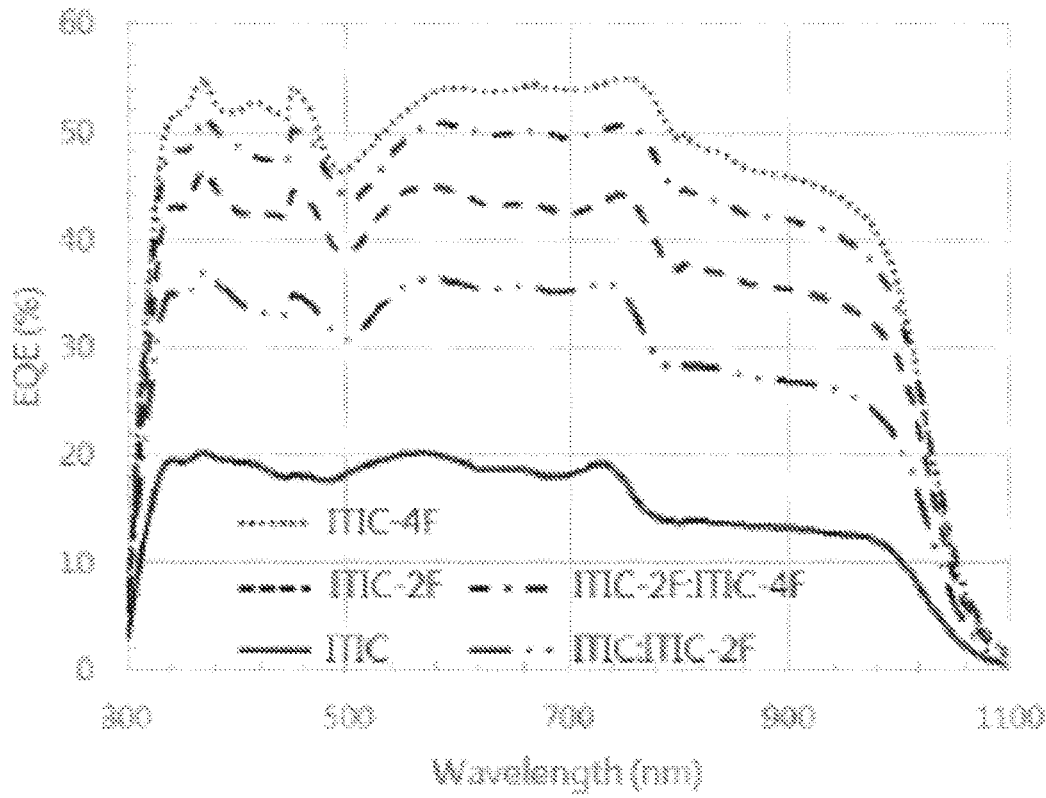
FIG. 3A is a graph of external quantum efficiency vs. wavelength for an OPD according to some embodiments having a bulk heterojunction layer containing two different fluorinated acceptors and two comparative OPDs containing only one acceptor.
Figure 3B:
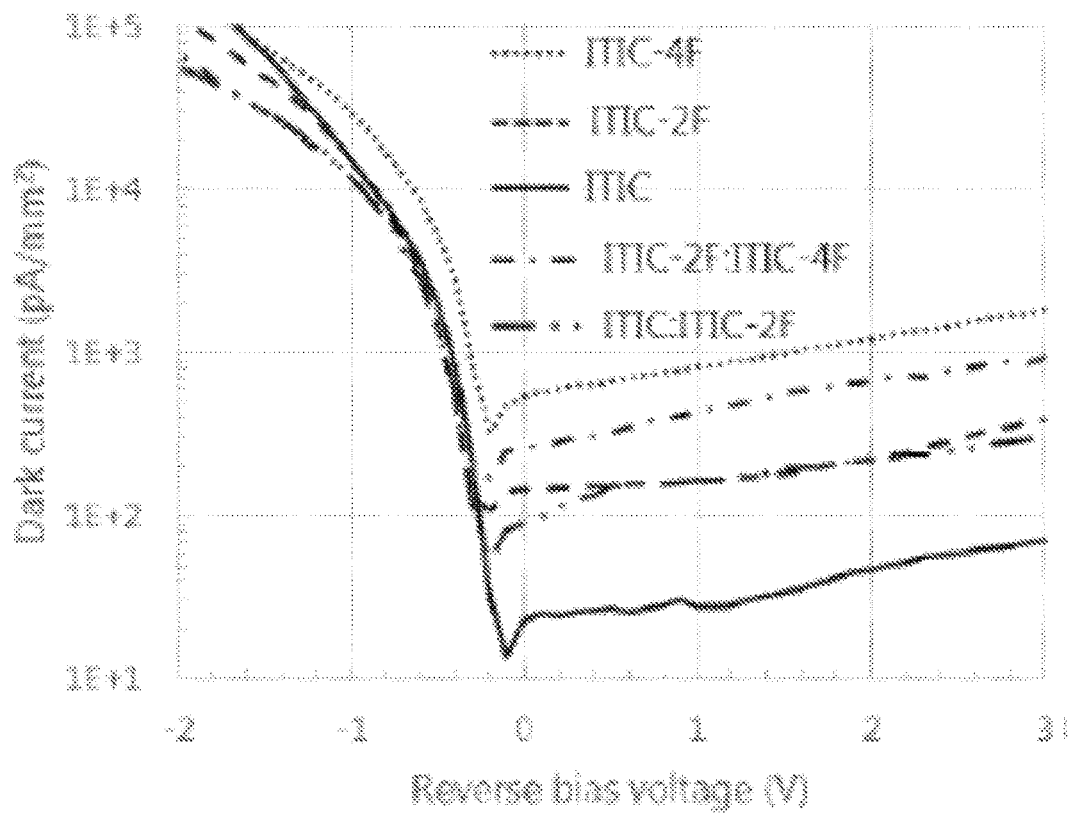
FIG. 3B is a graph of dark current vs. reverse bias for the OPDs described with reference to FIG. 3A.

FIGS. 3A and 3B, illustrate a similar trend for Device Examples 2 and 3 compared to Comparative Devices 1-3.

Thus, external quantum efficiency and dark current can be tuned according to the requirements of any given photodetector application by selection of the acceptor materials and the ratio of the acceptor materials.

HOMO and LUMO Energy Levels

HOMO and LUMO energy levels of compounds reported herein were determined from films of the compounds using square wave voltammetry (SWV) at room temperature. In Square wave Voltammetry, the current at a working electrode is measured while the potential between the working electrode and a reference electrode is swept linearly in time. The difference current between a forward and reverse pulse is plotted as a function of potential to yield a voltammogram. The apparatus to measure HOMO or LUMO energy levels by SWV may comprise a cell containing tertiary butyl ammonium perchlorate or tertiary butyl ammonium hexafluorophosphate in acetonitrile; a glassy carbon working electrode; a platinum counter electrode and a leak free Ag/AgCl reference electrode.

Ferrocene is added directly to the existing cell at the end of the experiment for calculation purposes where the potentials are determined for the oxidation and reduction of ferrocene versus Ag/AgCl using cyclic voltammetry (CV).

Apparatus:
CHI 660D Potentiostat.

3 mm diameter glassy carbon working electrode Leak free Ag/AgCl reference electrode Pt wire auxiliary or counter electrode.

0.1 M tetrabutylammonium hexafluorophosphate in acetonitrile.

Method:
The sample is dissolved in Toluene (3 mg/ml) and spun at 3000 rpm directly on to the glassy carbon working electrode.

LUMO=4.8-$E$ ferrocene (peak to peak average)−$E$ reduction of sample (peak maximum).

HOMO=4.8-$E$ ferrocene (peak to peak average)+$E$ oxidation of sample (peak maximum).

A typical SWV experiment runs at 15 Hz frequency; 25 mV amplitude and 0.004V increment steps. Results are calculated from 3 freshly spun film samples for both the HOMO and LUMO data.

All experiments are run under an Argon gas purge.

The invention claimed is:

1. A composition comprising a first compound and a second compound of formula (I):

$$\text{EAG-EDG-EAG} \tag{I}$$

wherein EDG is an electron-donating group comprising a polycyclic heteroaromatic group and each EAG is an electron-accepting group of formula (II):

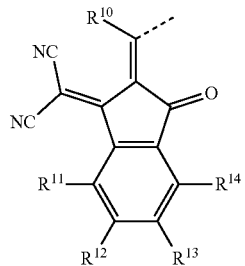

(II)

wherein:
--- is a bond to EDG;
each $R^{10}$ is, independently in each occurrence, H or a substituent;
each $R^{11}$-$R^{14}$ is, independently in each occurrence, H or an electron-withdrawing group; and
of the first and second compounds of formula (I), the total number of electron-withdrawing groups $R^{11}$-$R^{14}$ is greater for the first compound of formula (I).

2. The composition according to claim 1 wherein each electron-withdrawing group $R^{11}$-$R^{14}$ is selected from F, Cl, Br, I and CN.

3. The composition according to claim 1 wherein each occurrence of at least two of $R^{11}$-$R^{14}$ of the first compound is F or CN.

4. The composition according to claim 1 wherein each one of $R^{11}$-$R^{14}$ of the second compound is H.

5. The composition according to claim 1 wherein at least one of the first and second compounds has formula (Ia):

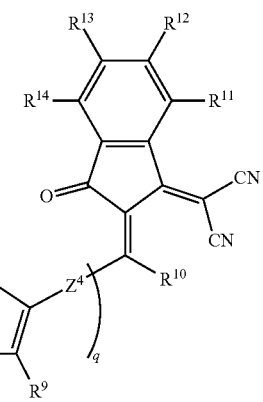

(Ia)

wherein:
Ar is furan, thiophene or benzene which is unsubstituted or substituted with one or more substituents;
each Y is independently O or S;

each A is independently O, S or $CR^1R^2$ wherein $R^1$ and $R^2$ independently in each occurrence is a substituent;
each $R^4$-$R^9$ is independently H or a substituent;
p is 0, 1, 2 or 3;
q is 0, 1, 2 or 3;
$Z^1$ is a direct bond or, together with $R^4$ or $R^5$, forms an aromatic or heteroaromatic group $Ar^1$;
$Z^2$ is a direct bond or, together with $R^7$ or $R^8$, forms an aromatic or heteroaromatic group $Ar^2$;
$Z^3$ is a direct bond or, together with $R^6$, forms an aromatic or heteroaromatic group $Ar^3$; and
$Z^4$ is a direct bond or, together with $R^9$, forms an aromatic or heteroaromatic group $Ar^4$.

6. The composition according to claim 5 wherein at least one of the first and second compounds has formula (Ib):

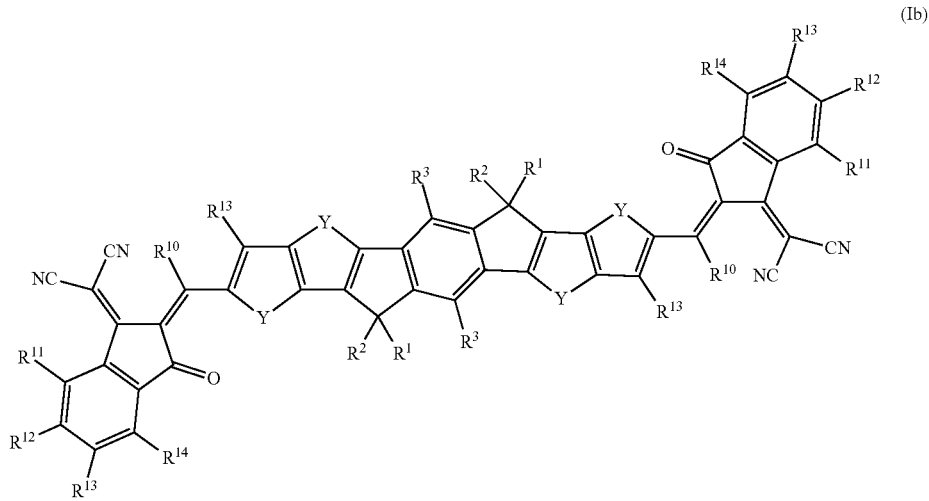

wherein each $R^3$ is, independently in each occurrence, H or a substituent.

7. The composition according to claim 5 wherein $R^1$ and $R^2$ independently in each occurrence are selected from the group consisting of:
linear, branched or cyclic $C_{1-20}$ alkyl wherein one or more non-adjacent, non-terminal C atoms may be replaced by O, S, $NR^{15}$, CO or COO wherein $R^{15}$ is a $C_{1-12}$ hydrocarbyl and one or more H atoms of the $C_{1-20}$ alkyl may be replaced with F; and
a group of formula $(Ak)_u$-$(Ar^6)_v$ wherein Ak is a $C_{1-12}$ alkylene chain in which one or more C atoms may be replaced with O, S, CO or COO; u is 0 or 1; $Ar^6$ in each occurrence is independently an aromatic or heteroaromatic group which is unsubstituted or substituted with one or more substituents; and v is at least 1.

8. The composition according to claim 7 wherein at least one of $R^1$ and $R^2$ is phenyl which is unsubstituted or substituted with one or more substituents selected from $C_{1-20}$ alkyl wherein one or more non-adjacent, non-terminal C atoms may be replaced by O, S, $NR^{15}$ wherein $R^{15}$ is a $C_{1-12}$ hydrocarbyl, CO or COO and one or more H atoms of the $C_{1-20}$ alkyl may be replaced with F.

9. The composition according to claim 1 wherein the composition further comprises an electron donor material capable of donating an electron to the first and second compounds of formula (I).

10. A formulation comprising a composition according to claim 1 dissolved or dispersed in one or more solvents.

11. An organic photodetector comprising: an anode; a cathode; and a photosensitive organic layer disposed between the anode and cathode wherein the photosensitive organic layer comprises a composition according to claim 9.

12. A method of forming an organic photodetector according to claim 11 comprising forming the photosensitive organic layer over one of the anode and cathode and forming the other of the anode and cathode over the photosensitive organic layer.

13. A method according to claim 12 wherein forming the photosensitive organic layer comprises depositing a formulation comprising a composition dissolved or dispersed in one or more solvents and evaporating the one or more solvents.

14. A photosensor comprising a light source and an organic photodetector according to claim 11 configured to detect light emitted from the light source.

15. A photosensor according to claim 14 configured to receive a sample in a light path between the organic photodetector and the light source.

16. A method of determining the presence and/or concentration of a target material in a sample, the method comprising illuminating the sample and measuring a response of the organic photodetector according to claim 11 configured to receive light emitted from the sample upon illumination.

17. A method according to claim 16 wherein the organic photodetector is the organic photodetector of a photosensor.

* * * * *